United States Patent
Sun

(10) Patent No.: US 11,521,980 B2
(45) Date of Patent: Dec. 6, 2022

(54) READ-ONLY MEMORY CELL AND ASSOCIATED MEMORY CELL ARRAY

(71) Applicant: eMemory Technology Inc., Hsin-Chu (TW)

(72) Inventor: Wein-Town Sun, Hsinchu County (TW)

(73) Assignee: EMEMORY TECHNOLOGY INC., Hsin-Chu (TW)

(*) Notice: Subject to any disclaimer, the term of this patent is extended or adjusted under 35 U.S.C. 154(b) by 85 days.

(21) Appl. No.: 17/027,750

(22) Filed: Sep. 22, 2020

(65) Prior Publication Data

US 2021/0151448 A1 May 20, 2021

Related U.S. Application Data

(60) Provisional application No. 62/935,093, filed on Nov. 14, 2019.

(51) Int. Cl.
| | |
|---|---|
| *H01L 27/11524* | (2017.01) |
| *H01L 29/788* | (2006.01) |
| *H01L 49/02* | (2006.01) |
| *G06F 7/58* | (2006.01) |
| *H03K 3/84* | (2006.01) |

(52) U.S. Cl.
CPC ........ *H01L 27/11524* (2013.01); *G06F 7/588* (2013.01); *H01L 28/40* (2013.01); *H01L 29/7884* (2013.01); *H03K 3/84* (2013.01)

(58) Field of Classification Search
None
See application file for complete search history.

(56) References Cited

U.S. PATENT DOCUMENTS

| | | |
|---|---|---|
| 6,678,190 B2 | 1/2004 | Yang et al. |
| 6,822,286 B2 | 11/2004 | Hsu et al. |
| 8,501,562 B1 | 8/2013 | Horch |
| 8,592,886 B2 | 11/2013 | Hsu et al. |
| 2017/0213595 A1* | 7/2017 | Park ................. G11C 16/26 |

* cited by examiner

*Primary Examiner* — Xiaoming Liu
(74) *Attorney, Agent, or Firm* — WPAT, PC

(57) ABSTRACT

A read-only memory cell array includes a first storage state memory cell and a second storage state memory cell. The first storage state memory cell includes a first transistor and a second transistor. The first transistor is connected to a source line and a word line. The second transistor is connected to the first transistor and a first bit line. The second storage state memory cell includes a third transistor and a fourth transistor. The third transistor is connected to the source line and the word line. The fourth transistor is connected to the third transistor and a second bit line. A gate terminal of the fourth transistor is connected to a gate terminal of the third transistor.

13 Claims, 10 Drawing Sheets

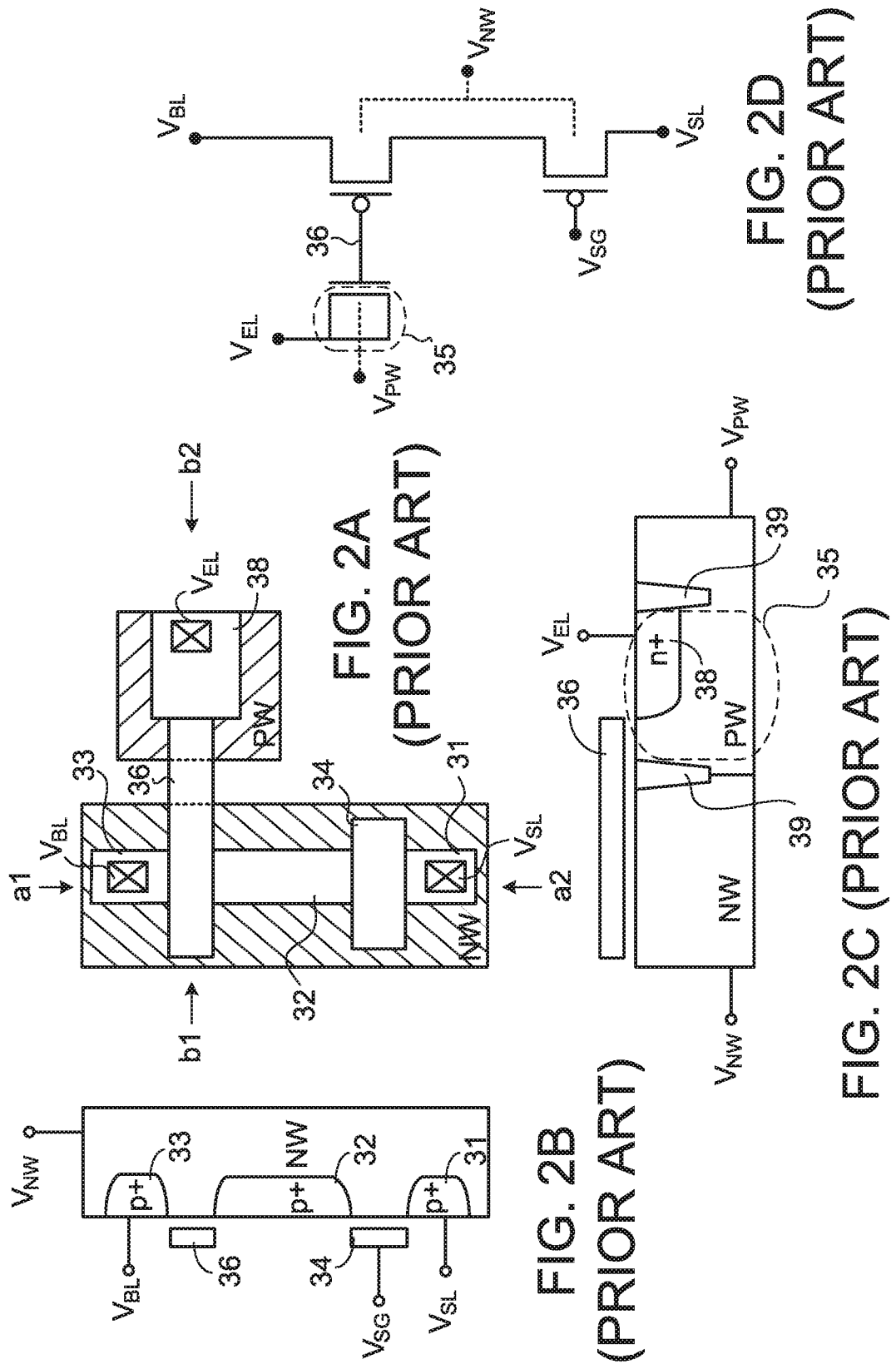

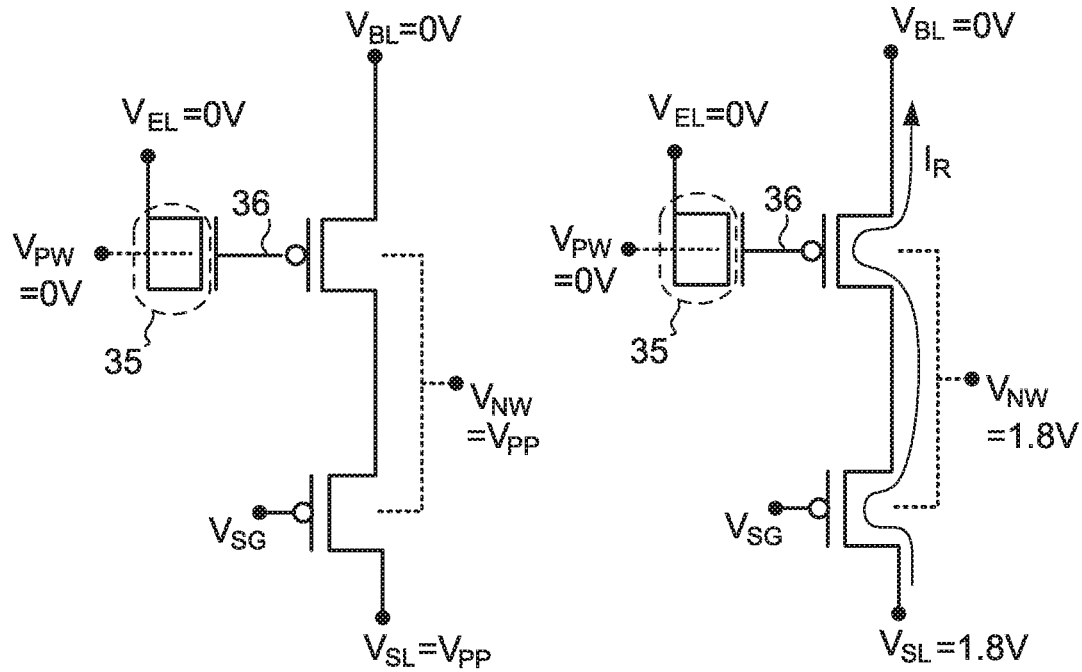
FIG. 3A
(PRIOR ART)
FIG. 3C
(PRIOR ART)
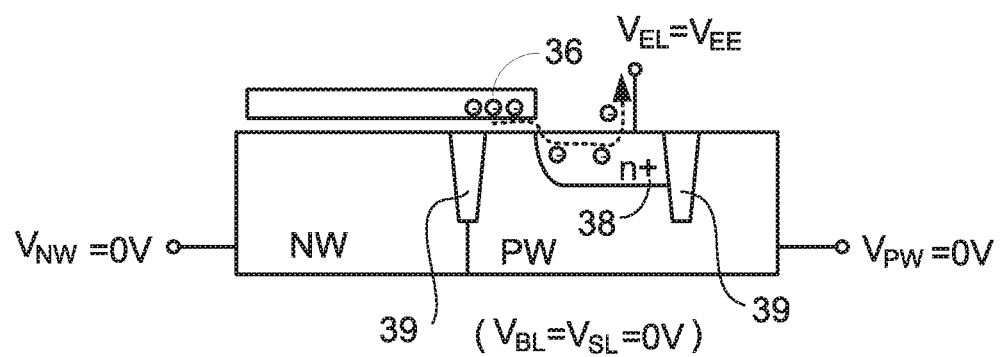
FIG. 3B
(PRIOR ART)

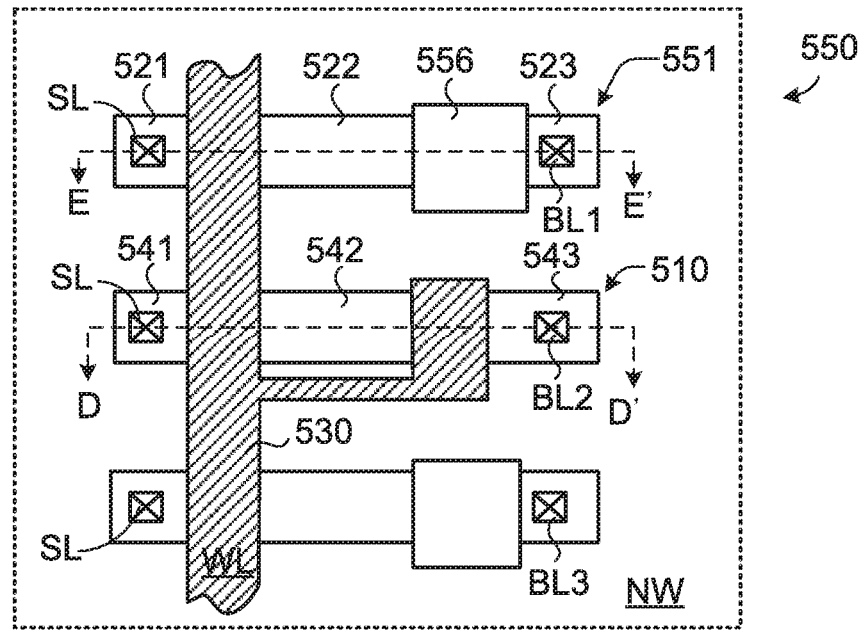
FIG. 6A
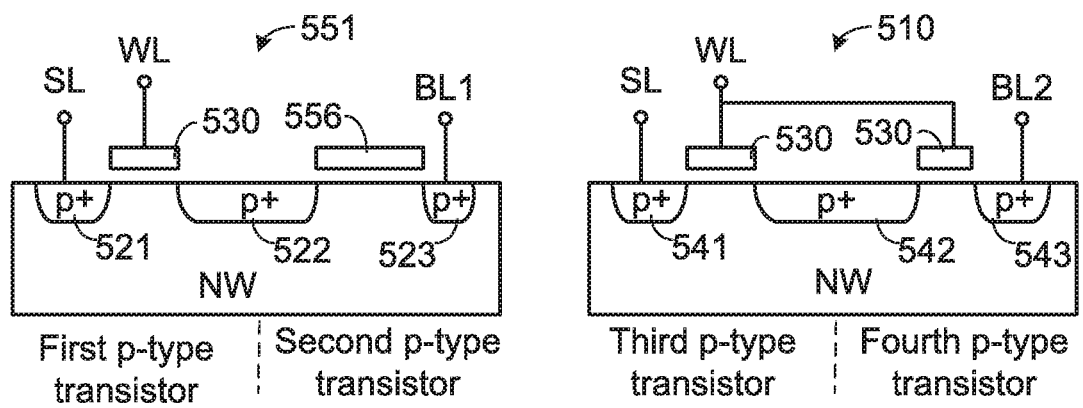
FIG. 6B
FIG. 6C

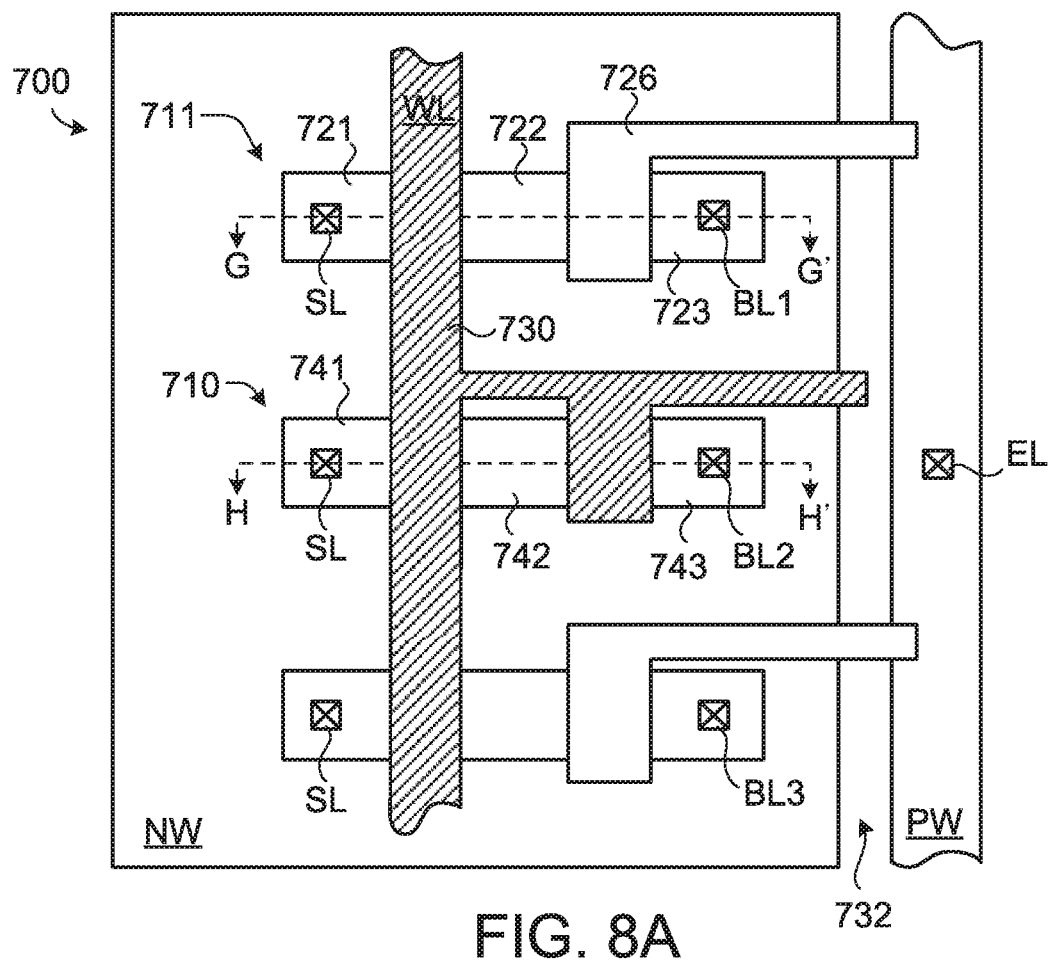
FIG. 8A
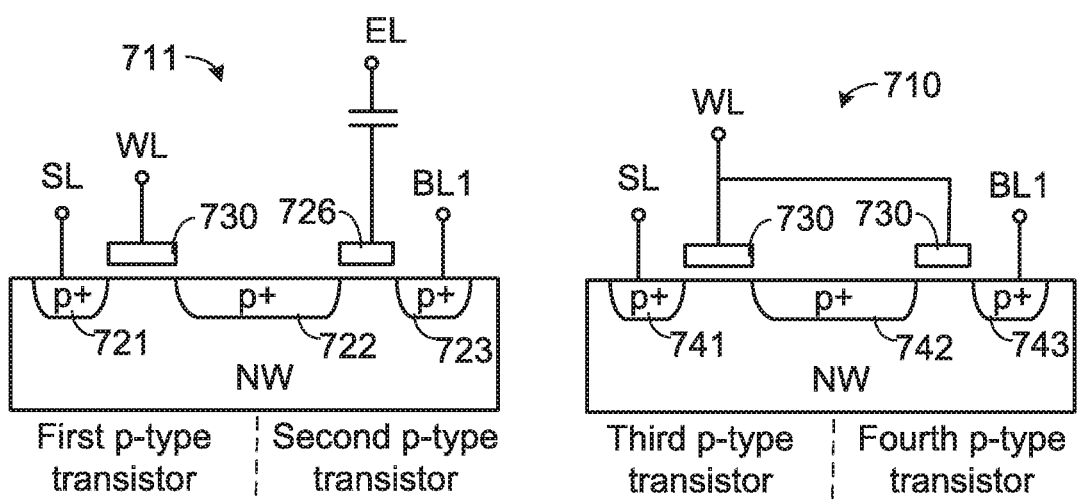
FIG. 8B
FIG. 8C

READ-ONLY MEMORY CELL AND ASSOCIATED MEMORY CELL ARRAY

This application claims the benefit of U.S. provisional application Ser. No. 62/935,093, filed Nov. 14, 2019, the subject matter of which is incorporated herein by reference.

APPLIED TO FIELD OF THE INVENTION

The present invention relates to a non-volatile memory cell and an associated memory cell array, and more particularly to a read-only memory cell and an associated memory cell array.

BACKGROUND OF THE INVENTION

As is well known, a non-volatile memory is able to continuously retain data after the supplied power is interrupted. Generally, after the non-volatile memory leaves the factory, the user may program the non-volatile memory in order to record data into the memory cells of the non-volatile memory.

According to the number of times the non-volatile memory is programmed, the non-volatile memory cells may be classified into several types, including multi-time programmable memory cells (also referred as MTP memory cells), one time programmable memory cells (also referred as OTP memory cells) and read-only memory cells (also referred as ROM memory cells).

Generally, the stored data of the MTP memory cell may be modified many times. On the contrary, the OTP memory cell may be programmed once. After the OTP memory cell is programmed, the stored data cannot be modified. After the read-only memory cells leaves the factory, all stored data have been recorded therein. The user is only able to read the stored data from the read-only memory cells, but unable to program the read-only memory cells.

Moreover, the memory cell of the non-volatile memory can be programmed to be in one of at least two storage states. For example, the memory cell in the first storage state generates a lower cell current, and the memory cell in the second storage state memory cell generates a higher cell current. While a read action is performed, a sensing circuit judges the storage state of the memory cell according to the magnitude of the cell current. Generally, the first storage state is referred as an erased state, and the second storage state memory cell is referred as a programmed state.

Moreover, U.S. Pat. No. 6,678,190 discloses a programmable single-poly non-volatile memory. FIG. 1A is a schematic cross-sectional view illustrating a memory cell of a conventional programmable single-poly non-volatile memory disclosed in U.S. Pat. No. 6,678,190. FIG. 1B is a schematic top view illustrating the memory cell of the conventional programmable single-poly non-volatile memory of FIG. 1A. FIG. 10 is a schematic equivalent circuit diagram illustrating the memory cell of the conventional programmable single-poly non-volatile memory of FIG. 1A.

Please refer to FIGS. 1A~1C. The memory cell of the conventional programmable single-poly non-volatile memory comprises two serially-connected p-type transistors. The first p-type transistor is used as a select transistor, and the second p-type transistor is used as a floating gate transistor. A select gate 24 of the first p-type transistor is connected to a select gate voltage $V_{SG}$. A p-type doped source region 21 is connected to a source line voltage $V_{SL}$. Moreover, a p-type doped drain region 22 may be considered as a combination of a p-type doped drain region of the first p-type transistor and a first p-type doped region of the second p-type transistor. A floating gate 26 is located at the top side of the second p-type transistor. A second p-type doped region 23 of the second p-type transistor is connected to a bit line voltage $V_{BL}$. Moreover, the second p-type transistor is constructed in an N-well region NW. The N-well region NW is connected to an N-well voltage $V_{NW}$.

By properly controlling the magnitudes of the select gate voltage $V_{SG}$, the source line voltage $V_{SL}$, the bit line voltage $V_{BL}$ and the N-well voltage $V_{NW}$, the conventional programmable single-poly non-volatile memory may be programmed or read. When the program action is performed, hot carriers (e.g., electrons) are injected into the floating gate 26. When the read action is performed, hot carriers are not injected into the floating gate 26. Consequently, the non-volatile memory is controlled to be in a first storage state or a second storage state.

As described in FIGS. 1A~1C, the memory cell of the non-volatile memory is only programmable or readable. However, the memory cell of the non-volatile memory is not erasable. In the memory cell of the non-volatile memory, the hot carriers are injected into the floating gate 26 according to the electrical property of the memory cell only. However, the electrical property fails cannot be utilized to remove the carriers from the floating gate. That is, for achieving the data-erasing function, the electrons stored in the floating gate 26 may be removed from the floating gate by exposing ultraviolet (UV) light to the non-volatile memory. Consequently, the memory cell of this non-volatile memory is referred as a one time programmable memory cell (i.e., the OTP memory cell).

Another programmable single-poly non-volatile memory is disclosed in U.S. Pat. No. 8,592,886. FIGS. 2A~2D schematically illustrate a memory cell of a single-poly nonvolatile memory disclosed in U.S. Pat. No. 8,592,886. FIG. 2A is a schematic top view illustrating the memory cell of the single-poly nonvolatile memory disclosed in U.S. Pat. No. 8,592,886. FIG. 2B is a schematic cross-sectional view illustrating the memory cell of FIG. 2A and taken along a first direction (a1-a2). FIG. 2C is a schematic cross-sectional view illustrating the memory cell of FIG. 2A and taken along a second direction (b1-b2). FIG. 2D is a schematic equivalent circuit diagram of the memory cell of FIG. 2A.

As shown in FIGS. 2A and 2B, the conventional memory cell comprises two serially-connected p-type transistors. The two p-type transistors are constructed in an N-well region NW. Three p-type doped regions 31, 32 and 33 are formed in the N-well region NW. In addition, two polysilicon gates 34 and 36 are spanned over the areas between the three p-type doped regions 31, 32 and 33.

The first p-type transistor is used as a select transistor. The second p-type transistor is used as a floating gate transistor. The polysilicon gate 34 of the first p-type transistor is connected to a select gate voltage $V_{SG}$. The p-type doped region 31 is a p-type doped source region and connected to a source line voltage $V_{SL}$. The p-type doped region 32 is a p-type doped drain region, which may be considered as a combination of a p-type doped drain region of the first p-type transistor and a first p-type doped region of the second p-type transistor. The polysilicon gate 36 (also referred as a floating gate) is located at the top side of the second p-type transistor. The p-type doped region 33 is a second p-type doped region of the second p-type transistor and connected to a bit line voltage $V_{BL}$. Moreover, the N-well region NW is connected to an N-well voltage $V_{NW}$. Generally, the polysilicon gate 34 of the first p-type transistor is connected to a word line, and the select gate voltage $V_{SG}$ is a word line control voltage. Moreover, the p-type doped source region 31 is connected to a source line, and the source line voltage $V_{SL}$ is a source line control voltage.

As shown in FIGS. 2A and 2C, the conventional memory cell further comprises an n-type transistor or a combination of the floating gate 36 and an erase gate region 35. The n-type transistor is constructed in a P-well region PW. An n-type doped region 38 is formed in the P-well region PW. In other words, the erase gate region 35 includes the P-well region PW and the n-type doped regions 38. Moreover, the first p-type transistor, the second p-type transistor and the n-type transistor are collaboratively defined as a multi-time programmable memory cell (i.e., an MTP memory cell).

As shown in FIG. 2A, the floating gate 36 is extended to and arranged adjacent to the erase gate region 35. Consequently, the floating gate 36 may be considered as a gate of the n-type transistor, and the n-type doped region 38 may be considered as a combination of an n-type doped source region and an n-type doped drain region of the n-type transistor. The n-type doped region 38 is connected to an erase line voltage $V_{EL}$. In addition, the P-well region PW is connected to a P-well voltage $V_{PW}$. As shown in FIG. 2C, an isolation structure 39 is formed between the P-well region PW and the N-well region NW. For example, the isolation structure 39 is a shallow trench isolation (STI) structure.

FIGS. 3A, 3B and 3C schematically illustrate the bias voltages provided to the MTP memory cell as shown in FIG. 2D when a program action, an erase action and a read action are respectively performed on the MTP memory cell.

Please refer to FIG. 3A. When the program action is performed, each of the bit line voltage $V_{BL}$, the erase line voltage $V_{EL}$ and the P-well voltage $V_{PW}$ is equal to a ground voltage (0V). Moreover, each of the N-well voltage $V_{NW}$ and the source line voltage $V_{SL}$ is equal to a first positive voltage $V_{pp}$. The magnitude of the first positive voltage $V_{pp}$ is in the range between +3.0V and +9.5V. Consequently, in case that the hot carriers (e.g. electrons) are transferred through a channel region corresponding to the floating gate 36, the hot carriers are injected into the floating gate 36. Meanwhile, the memory cell is in a second storage state. Whereas, in case that no hot carriers are injected into the floating gate 36, the memory cell is in a second storage state during the program action, the memory cell is in a first storage state.

Please refer to FIG. 3B. When the erase action is performed, each of the bit line voltage $V_{BL}$, the source line voltage $V_{SL}$, the N-well voltage $V_{NW}$ and the P-well voltage $V_{PW}$ is equal to the ground voltage (0V). Moreover, the erase line voltage $V_{EL}$ is equal to a second positive voltage $V_{EE}$. The second positive voltage $V_{EE}$ is in the range between +6.5V and +18V. As shown in FIG. 3B, if the erase line voltage $V_{EL}$ is equal to the second positive voltage $V_{EE}$, the stored carriers (e.g. electrons) are removed from the floating gate 36 and discharged out through the n-type doped region 38. Consequently, after the erased state, no carrier is stored in the floating gate 36.

Please refer to FIG. 3C. When the read action is performed, the bit line voltage $V_{BL}$ is equal to ground voltage (0V), the source line voltage $V_{SL}$ is equal to 1.8V, the N-well voltage $V_{NW}$ is equal to 1.8V, the erase line voltage $V_{EL}$ is equal to ground voltage (0V), and the P-well voltage $V_{PW}$ is equal to the ground voltage (0V). Depending on the situation of whether the electrons are stored in the floating gate 36, different magnitudes of the read current $I_R$ are acquired. During the read action, the storage state of the non-volatile memory cell can be realized according to the read current $I_R$. For example, in the first storage state, the read current $I_R$ is lower than 0.1 μA. In the second storage state, the read current $I_R$ is higher than 5 μA. According to the read current of the memory cell, a sensing circuit judges the storage state of the memory cell.

Generally, during the process of manufacturing the read only memory, the storage states of all memory cells are directly defined. That is, after the read-only memory leaves the factory, the data about the corresponding storage states have been recorded in all ROM cells. The user is only able to read the storage states from the ROM cells, but unable to program the ROM cells. That is, before the read only memory is produced, the user may provide specified binary codes to the manufacturer of the read only memory. After the read-only memory is produced and sent to the user, the specified binary codes have been recorded in the ROM cells of the mask read only memory, and cannot be programmed or erased again.

A conventional read-only memory cell is disclosed in U.S. Pat. No. 6,822,286. The structure of the read-only memory cell is modified on the basis of the OPT memory cell as shown in FIG. 1A.

FIG. 4A is a schematic top view illustrating the structure of a conventional read-only memory cell array. FIG. 4B is a schematic equivalent circuit diagram of the read-only memory cell array as shown in FIG. 4A. The memory cell array 400 is constructed in an N-well region NW. The memory cell array 400 comprises a first storage state memory cell 411 and a second storage state memory cell 410.

The first storage state memory cell 411 comprises two serially-connected p-type transistors. The two p-type transistors are constructed in an N-well region NW. Three p-type doped regions 421, 422 and 423 are formed in the N-well region NW. In addition, two polysilicon gates 430 and 426 are spanned over the areas between the three p-type doped regions 421, 422 and 423. The polysilicon gate 430 is a select gate. The polysilicon gate 426 is a floating gate. The first p-type transistor is defined by the polysilicon gate 430 and the p-type doped regions 421 and 422 collaboratively. The second p-type transistor is defined by the polysilicon gate 426 and the p-type doped regions 422 and 423 collaboratively. The first p-type transistor is used as a select transistor. The second p-type transistor is used as a floating gate transistor.

In the first storage state memory cell 411, the polysilicon gate 430 of the first p-type transistor is connected to a word line WL, and the p-type doped region 421 is connected to a source line SL. Moreover, the p-type doped region 422 may be considered as a combination of a p-type doped drain region of the first p-type transistor and a first p-type doped region of the second p-type transistor. The floating gate 426 is located at the top side of the second p-type transistor. The second p-type doped region 423 of the second p-type transistor is connected to a bit line BL1.

In comparison with the first storage state memory cell 411, the second storage state memory cell 410 is not equipped with the floating gate. That is, the second storage state memory cell 410 comprises a single p-type transistor. The p-type transistor is constructed in the N-well region NW. Since the second storage state memory cell 410 is not equipped with the floating gate, two p-type doped regions 441 and 442 are formed after an ion implantation process. Moreover, the polysilicon gate 430 is spanned over the area between the two p-type doped regions 441 and 442. A third p-type transistor is defined by the polysilicon gate 430 and the p-type doped regions 441 and 442 collaboratively. Moreover, the p-type doped region 442 may be considered as a resistor, and the resistance of the resistor is about 50~159 ohm/sq.

In the second storage state memory cell 410, the third p-type transistor is used as a select transistor. The polysilicon gate 430 of the third p-type transistor is connected to the word line WL. The p-type doped region 441 is connected to the source line SL. Moreover, the p-type doped region 442 is a p-type doped drain region and connected to a bit line BL2.

Please refer to the equivalent circuit as shown in FIG. 4B. The first storage state memory cell 411 comprises the first p-type transistor and the second p-type transistor. The source terminal of the first p-type transistor is connected to the source line SL. The gate terminal of the first p-type transistor is connected to the word line WL. The drain terminal of the first p-type transistor is connected to a first terminal of the second p-type transistor. A second terminal of the second p-type transistor is connected to the bit line BL1. The second storage state memory cell 410 comprises the third p-type transistor and a resistor. The source terminal of the third p-type transistor is connected to the source line SL. The gate terminal of the third p-type transistor is connected to the word line WL. The drain terminal of the third p-type transistor is connected to a first terminal of the resistor. A second terminal of the resistor is connected to the bit line BL2.

Please refer to FIG. 4B again. When a read action is performed, a select gate voltage $V_{SG}$ is provided to the word line WL. Consequently, the first p-type transistor and the third p-type transistor are turned on. Moreover, a bit line voltage $V_{BL1}$ is provided to the bit line BL1, a bit line voltage $V_{BL2}$ is provided to the bit line BL2, and a source line voltage $V_{SL}$ is provided to the source line SL. For example, the bit line voltage $V_{BL1}$ is equal to the ground voltage (0V), the bit line voltage $V_{BL2}$ is equal to the ground voltage (0V), and the source line voltage $V_{SL}$ is 1.8V.

When the first p-type transistor of the first storage state memory cell 411 is turned on, the second p-type transistor (i.e., the floating gate transistor) is turned off because no electrons are stored in the floating gate 426. Consequently, the first storage state memory cell 411 generates a read current Ir1 to the bit line BL1. The magnitude of the read current Ir1 is very low (e.g., nearly zero).

When the third p-type transistor of the second storage state memory cell 410 is turned on, the second storage state memory cell 410 generates a higher read current Ir2 to the bit line BL2 because the resistance of the resistor is very low.

As mentioned above, during the read action, the storage state of the read-only memory cell can be realized according to the magnitudes of the read currents flowing through the bit lines BL1 and BL2.

However, the read-only memory cell of FIG. 4B still has some drawbacks. For example, in case that the OTP memory cell as shown in FIG. 1C is programmed to the second storage state, the channel resistance of each p-type transistor is about 25 k ohm/sq and the total channel resistance of the two serially-connected p-type transistors is about 50 k ohm/sq. Consequently, the read current generated by each OTP memory cell in the second storage state is about 5~10 µA. Whereas, the resistance of the second storage state memory cell 410 as shown in FIG. 4B is very small. During the read action, the read current Ir2 generated by the second storage state memory cell 410 is about 10~20 µA. However, the magnitude of the read current Ir2 may exceed the specifications.

Moreover, after the first storage state memory cell 411 is produced, electrons may be retained in the floating gate 426 of the second p-type transistor (i.e., the floating gate transistor). Consequently, the second p-type transistor cannot be turned off completely. In other words, the first storage state memory cell 411 generates the higher read current Ir1 during the read action.

SUMMARY OF THE INVENTION

The present invention provides a read-only memory cell (ROM cell) by modifying the structures of the conventional MTP cell and conventional OTP cells.

An embodiment of the present invention provides a read-only memory cell array. The read-only memory cell array includes a first storage state memory cell and a second storage state memory cell. The first storage state memory cell includes a first transistor and a second transistor. A first terminal of the first transistor is connected to a source line. A gate terminal of the first transistor is connected to a word line. A first terminal of the second transistor is connected to a second terminal of the first transistor. A second terminal of the second transistor is connected to a first bit line. The second transistor is a floating gate transistor. The second storage state memory cell includes a third transistor and a fourth transistor. A first terminal of the third transistor is connected to the source line. A gate terminal of the third transistor is connected to the word line. A first terminal of the fourth transistor is connected to a second terminal of the third transistor. A second terminal of the fourth transistor is connected to a second bit line. A gate terminal of the fourth transistor is connected to the gate terminal of the third transistor.

Another embodiment of the present invention provides a read-only memory cell array. The read-only memory cell array includes a first storage state memory cell and a second storage state memory cell. The first storage state memory cell includes a first transistor and a first capacitor. A first terminal of the first transistor is connected to a source line. A gate terminal of the first transistor is connected to a word line. A first terminal of the first capacitor is connected to a second terminal of the first transistor. A second terminal of the first capacitor is connected to a first bit line. The second storage state memory cell includes a second transistor and a third transistor. A first terminal of the second transistor is connected to the source line. A gate terminal of the second transistor is connected to the word line. A first terminal of the third transistor is connected to a second terminal of the second transistor. A second terminal of the third transistor is connected to a second bit line. A gate terminal of the third transistor is connected to the gate terminal of the second transistor.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 2A (prior art) is a schematic top view illustrating the memory cell of the single-poly nonvolatile memory disclosed in U.S. Pat. No. 8,592,886;

FIG. 2B (prior art) is a schematic cross-sectional view illustrating the memory cell of FIG. 2A and taken along a first direction (a1-a2);

FIG. 2C (prior art) is a schematic cross-sectional view illustrating the memory cell of FIG. 2A and taken along a second direction (b1-b2);

FIG. 2D (prior art) is a schematic equivalent circuit diagram of the memory cell of FIG. 2A;

FIGS. 3A, 3B and 3C (prior art) schematically illustrate the bias voltages provided to the MTP memory cell as shown in FIG. 2D when a program action, an erase action and a read action are respectively performed on the MTP memory cell;

FIG. 6A is a schematic top view illustrating the structure of a read-only memory cell array according to a second embodiment of the present invention;

FIG. 6B is a schematic cross-sectional view illustrating a first storage memory cell of the read-only memory cell array as shown in FIG. 6A and taken along a first direction (E-E');

FIG. 6C is a schematic cross-sectional view illustrating a second storage memory cell of the read-only memory cell array as shown in FIG. 5A and taken along a second direction (D-D');

FIG. 8A is a schematic top view illustrating the structure of a read-only memory cell array according to a fourth embodiment of the present invention;

FIG. 8B is a schematic cross-sectional view illustrating a first storage memory cell of the read-only memory cell array as shown in FIG. 8A and taken along a first direction (G-G');

FIG. 8C is a schematic cross-sectional view illustrating a second storage memory cell of the read-only memory cell array as shown in FIG. 8A and taken along a second direction (H-H');

DETAILED DESCRIPTION OF PREFERRED EMBODIMENTS

The present invention provides a read-only memory cell (ROM cell) by modifying the structures of the conventional MTP cell and conventional OTP cells.

Figure 1A:
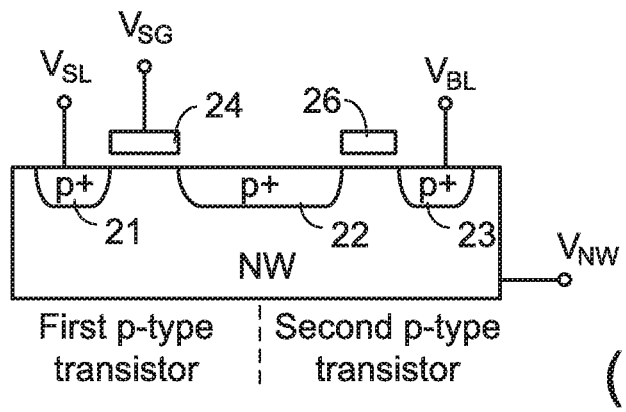
FIG. 1A (prior art) is a schematic cross-sectional view illustrating a memory cell of a conventional programmable single-poly non-volatile memory disclosed in U.S. Pat. No. 6,678,190.
Figure 1B:
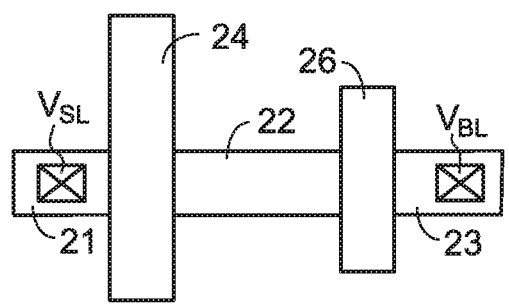
FIG. 1B (prior art) is a schematic top view illustrating the memory cell of the conventional programmable single-poly non-volatile memory of FIG. 1A.
Figure 1C:
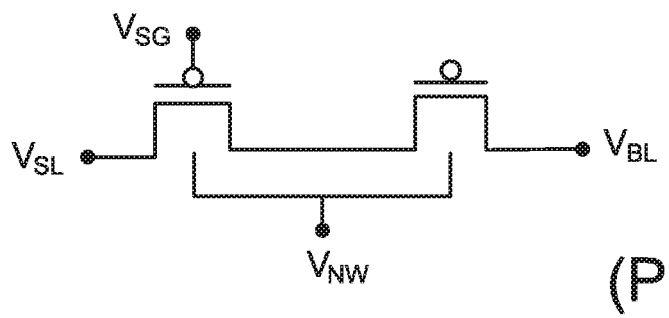
FIG. 1C (prior art) is a schematic equivalent circuit diagram illustrating the memory cell of the conventional programmable single-poly non-volatile memory of FIG. 1A.
Figure 4A:
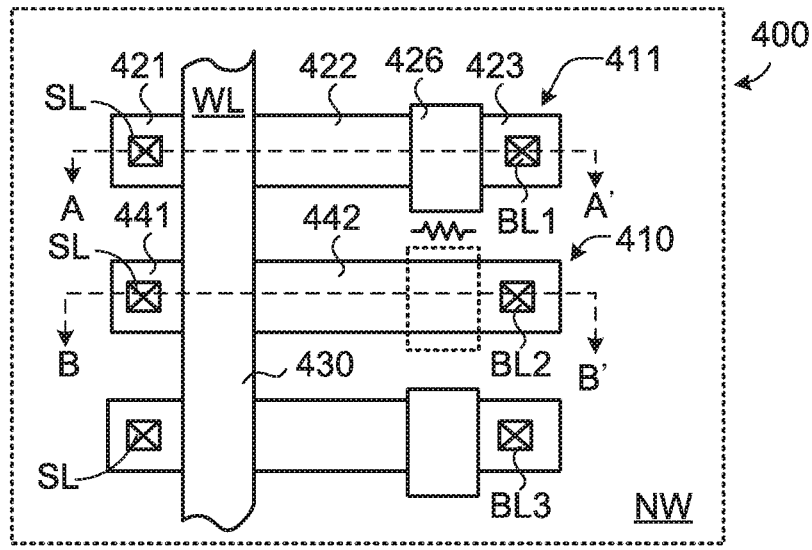
FIG. 4A (prior art) is a schematic top view illustrating the structure of a conventional read-only memory cell array.
Figure 4B:
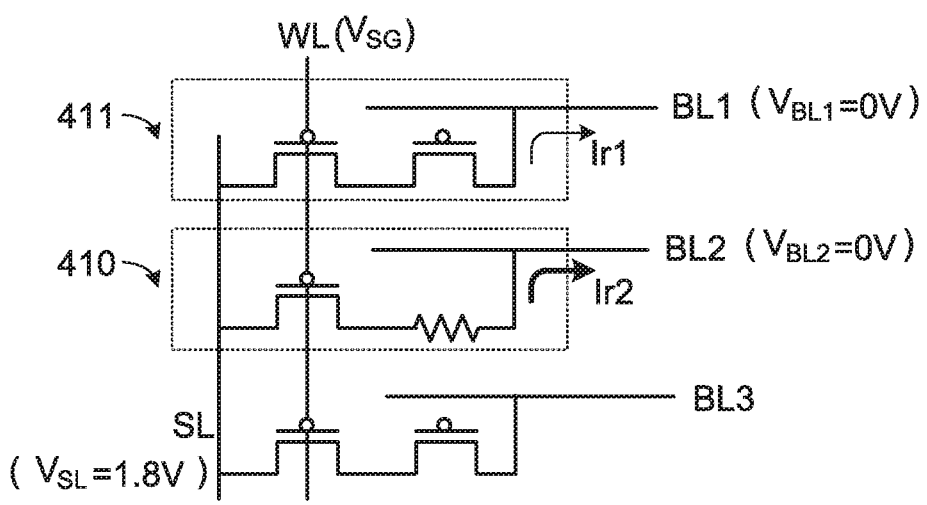
FIG. 4B (prior art) is a schematic equivalent circuit diagram of the read-only memory cell array as shown in FIG. 4A.
Figure 5A:
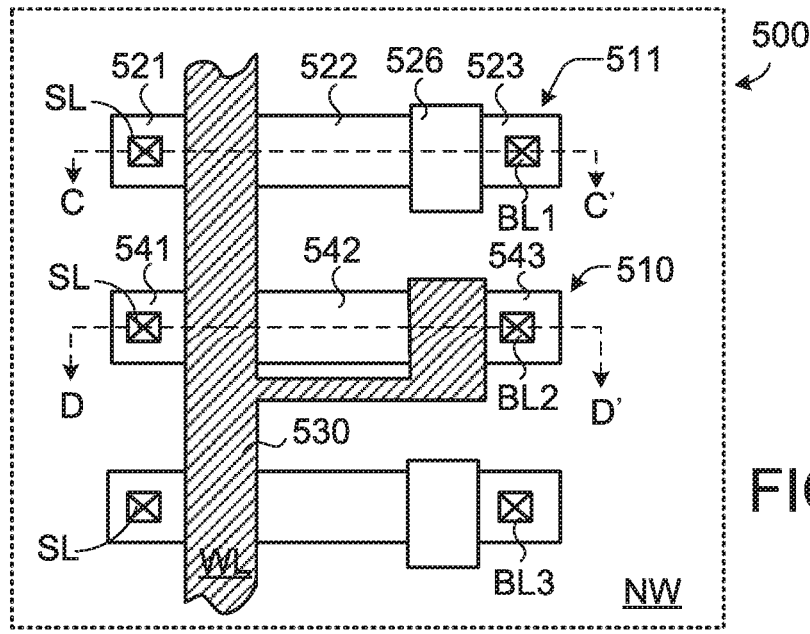
FIG. 5A is a schematic top view illustrating the structure of a read-only memory cell array according to a first embodiment of the present invention.
Figure 5B:
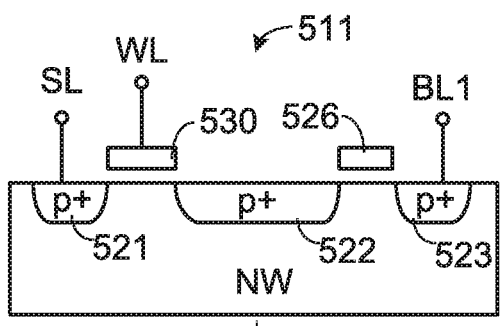
FIG. 5B is a schematic cross-sectional view illustrating a first storage memory cell of the read-only memory cell array as shown in FIG. 5A and taken along a first direction (C-C')
Figure 5C:
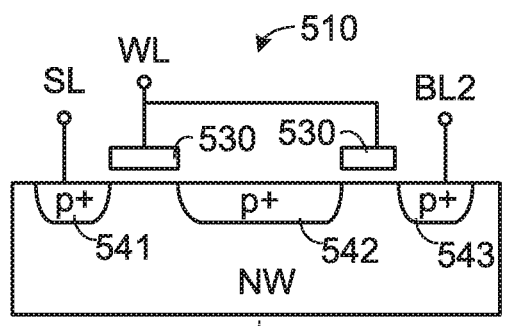
FIG. 5C is a schematic cross-sectional view illustrating a second storage memory cell of the read-only memory cell array as shown in FIG. 5A and taken along a second direction (D-D')
Figure 5D:
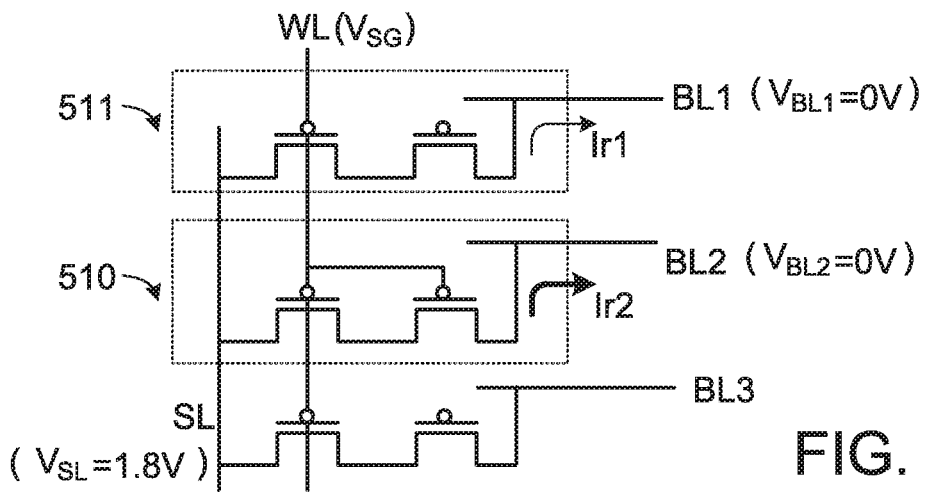
FIG. 5D is a schematic equivalent circuit diagram of the read-only memory cell array as shown in FIG. 5A.

Please refer to FIGS. 5A-5D. FIG. 5A is a schematic top view illustrating the structure of a read-only memory cell array according to a first embodiment of the present invention. FIG. 5B is a schematic cross-sectional view illustrating a first storage memory cell of the read-only memory cell array as shown in FIG. 5A and taken along a first direction (C-C'). FIG. 5C is a schematic cross-sectional view illustrating a second storage memory cell of the read-only memory cell array as shown in FIG. 5A and taken along a second direction (D-D'). FIG. 5D is a schematic equivalent circuit diagram of the read-only memory cell array as shown in FIG. 5A.

As shown in FIG. 5A, the memory cell array 500 is constructed in an N-well region NW. The memory cell array 500 comprises a first storage state memory cell 511 and a second storage state memory cell 510.

As shown in FIG. 5B, the first storage state memory cell 511 comprises two serially-connected p-type transistors. The two p-type transistors are constructed in an N-well region NW. Three p-type doped regions 521, 522 and 523 are formed in the N-well region NW. In addition, two polysilicon gates 530 and 526 are spanned over the areas between the three p-type doped regions 521, 522 and 523. The first p-type transistor is defined by the polysilicon gate 530 and the p-type doped regions 521 and 522 collaboratively. The second p-type transistor is defined by the polysilicon gate 526 and the p-type doped regions 522 and 523 collaboratively. The polysilicon gate 530 is a select gate. The polysilicon gate 526 is a floating gate.

The first p-type transistor is used as a select transistor. The second p-type transistor is used as a floating gate transistor. The polysilicon gate 530 of the first p-type transistor is connected to a word line WL. The p-type doped region 521 is a p-type doped source region and connected to a source line SL. The p-type doped region 522 is a p-type doped drain region. Moreover, the p-type doped region 522 may be considered as a combination of a p-type doped drain region of the first p-type transistor and a first p-type doped region of the second p-type transistor. The floating gate 526 is located at the top side of the second p-type transistor. The second p-type doped region 523 of the second p-type transistor is connected to a bit line BL1.

The second storage state memory cell 510 comprises a third p-type transistor and a fourth p-type transistor. In comparison with the first storage state memory cell 511, the second storage state memory cell 510 is not equipped with the floating gate. Whereas, the polysilicon gate 530 of the third p-type transistor is extended to the fourth p-type transistor and used as the gate of the fourth p-type transistor. In other words, the fourth p-type transistor of the second storage state memory cell 510 is not a floating gate transistor.

As shown in FIG. 5C, the second storage state memory cell 510 comprises two serially-connected p-type transistors. The two p-type transistors are constructed in the N-well region NW. The polysilicon gate 530 of the third p-type transistor is connected to a word line WL. The p-type doped region 541 is a p-type doped source region and connected to a source line SL. The p-type doped region 542 is a p-type doped drain region. Moreover, the p-type doped region 542 may be considered as a combination of a p-type doped drain region of the third p-type transistor and a first p-type doped region of the fourth p-type transistor. The second p-type doped region 543 of the fourth p-type transistor is connected to a bit line BL2. Moreover, the polysilicon gate 530 of the third p-type transistor and the polysilicon gate 530 of the fourth p-type transistor are connected with each other.

Please refer to the equivalent circuit as shown in FIG. 5D. The first storage state memory cell 511 comprises the first p-type transistor and the second p-type transistor. The first p-type transistor is used as a select transistor. The second p-type transistor is used as a floating gate transistor. A first terminal (i.e., a source terminal) of the first p-type transistor is connected to the source line SL. A gate terminal of the first p-type transistor is connected to the word line WL. A second terminal (i.e., a drain terminal) of the first p-type transistor is connected to a first terminal of the second p-type transistor. A second terminal of the second p-type transistor is connected to the bit line BL1.

The second storage state memory cell 510 comprises the third p-type transistor and the fourth p-type transistor. The third p-type transistor is a select transistor. A first terminal (i.e., a source terminal) of the third p-type transistor is connected to the source line SL. A gate terminal of the third p-type transistor is connected to the word line WL. A second terminal (i.e., a drain terminal) of the third p-type transistor is connected to a first terminal of the fourth p-type transistor. A second terminal of the fourth p-type transistor is connected to the bit line BL2. The gate terminal of the fourth p-type transistor is connected to the gate terminal of the third p-type transistor.

Please refer to FIG. 5D again. When a read action is performed, a select gate voltage $V_{SG}$ is provided to the word line WL. Consequently, the first p-type transistor and the third p-type transistor are turned on. Moreover, a bit line voltage $V_{BL1}$ is provided to the bit line BL1, a bit line voltage $V_{BL2}$ is provided to the bit line BL2, and a source line voltage $V_{SL}$ is provided to the source line SL. For example, the bit line voltage $V_{BL1}$ is equal to the ground voltage (0V), the bit line voltage $V_{BL2}$ is equal to the ground voltage (0V), and the source line voltage $V_{SL}$ is 1.8V. The source line voltage $V_{SL}$ (e.g., 1.8V) is a read voltage.

When the first p-type transistor of the first storage state memory cell 511 is turned on, the second p-type transistor is turned off because no electrons are stored in the floating gate 526 of the second p-type transistor. Consequently, the first storage state memory cell 511 generates a read current Ir1 to the bit line BL1. The magnitude of the read current Ir1 is very low (e.g., nearly zero).

In the second storage state memory cell 510, the gate terminal of the third p-type transistor and the gate terminal of the fourth p-type transistor are connected with each other. Consequently, when the third p-type transistor and the fourth p-type transistor are turned on simultaneously, the second storage state memory cell 510 generates a higher read current Ir2 to the bit line BL2.

As mentioned above, during the read action, the storage state of the read-only memory cell can be realized according to the magnitudes of the read currents flowing through the bit lines BL1 and BL2. Moreover, since the second storage state memory cell 510 comprises the two serially-connected p-type transistors, the magnitude of the read current Ir2 will not exceed the specifications.

Please refer to FIGS. 6A~6C. FIG. 6A is a schematic top view illustrating the structure of a read-only memory cell array according to a second embodiment of the present invention. FIG. 6B is a schematic cross-sectional view illustrating a first storage memory cell of the read-only memory cell array as shown in FIG. 6A and taken along a first direction (E-E'). FIG. 6C is a schematic cross-sectional view illustrating a second storage memory cell of the read-only memory cell array as shown in FIG. 5A and taken along a second direction (D-D').

The equivalent circuit of the read-only memory cell array 550 of this embodiment is identical to the equivalent circuit of the read-only memory cell array 500 of the first embodiment. In comparison with the first embodiment, the gate structure of the second p-type transistor in the first storage memory cell 551 of the read-only memory cell array 550 is distinguished. The structure of the second storage memory cell 510 of the read-only memory cell array 550 is identical to the structure of the first embodiment.

The first storage memory cell 551 comprises two serially-connected p-type transistors. The two p-type transistors are constructed in an N-well region NW. Three p-type doped regions 521, 522 and 523 are formed in the N-well region NW. In addition, two polysilicon gates 530 and 556 are spanned over the areas between the three p-type doped regions 521, 522 and 523. The first p-type transistor is defined by the polysilicon gate 530 and the p-type doped regions 521 and 522 collaboratively. The second p-type transistor is defined by the polysilicon gate 556 and the p-type doped regions 522 and 523 collaboratively. The polysilicon gate 530 is a select gate. The polysilicon gate 556 is a floating gate.

Please refer to FIGS. 6B and 6C. In this embodiment, the polysilicon gate 556 of the second p-type transistor in the first storage memory cell 551 is longer than the polysilicon gate 530 of the fourth p-type transistor in the second storage memory cell 510. Consequently, the channel length of the second p-type transistor of the first storage memory cell 551 is larger than the channel length of the fourth p-type transistor of the second storage memory cell 510.

Since the channel length of the second p-type transistor of the first storage memory cell 551 is larger, the threshold voltage is higher. That is, it is difficult to turn on the second p-type transistor of the first storage memory cell 551. After the memory cell array is produced, the second p-type transistor of the first storage memory cell 551 cannot be turned on in the read process even if carriers (electrons) are retained in the second p-type transistor of the first storage memory cell 551 during manufacturing. Consequently, it is confirmed that the magnitude of the read current generated by the first storage memory cell 551 is very low (e.g., nearly zero).

Figure 7A:
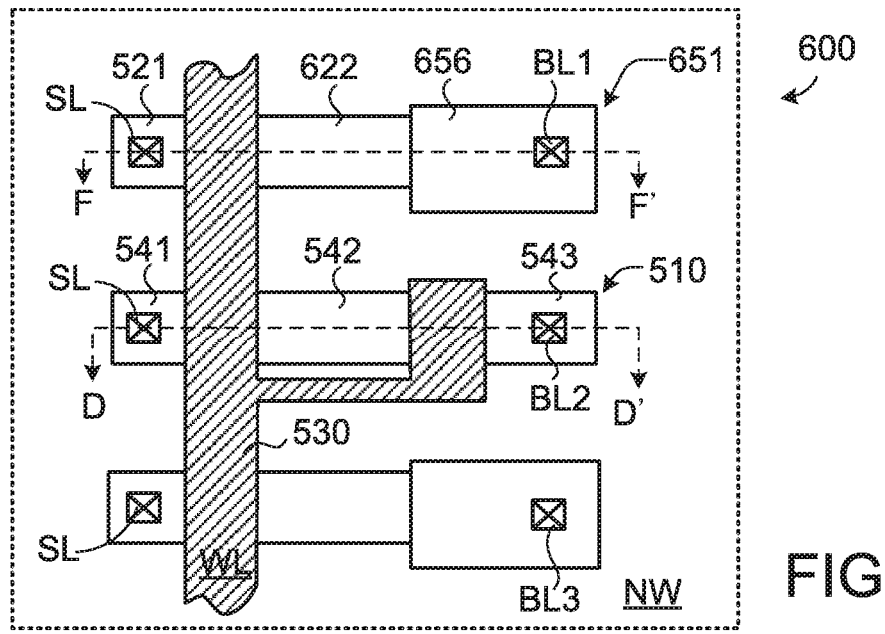
FIG. 7A is a schematic top view illustrating the structure of a read-only memory cell array according to a third embodiment of the present invention.
Figure 7B:
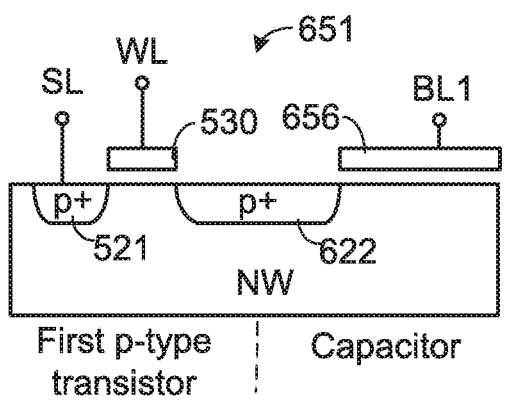
FIG. 7B is a schematic cross-sectional view illustrating a first storage memory cell of the read-only memory cell array as shown in FIG. 7A and taken along a first direction (F-F')
Figure 7C:
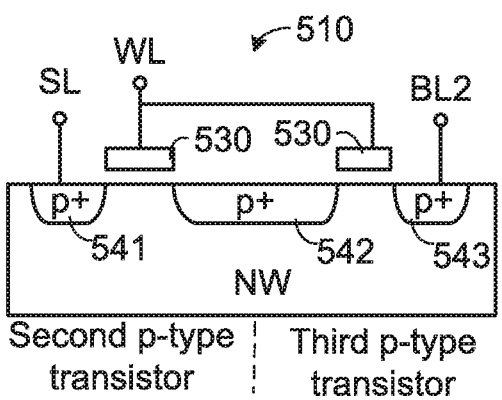
FIG. 7C is a schematic cross-sectional view illustrating a second storage memory cell of the read-only memory cell array as shown in FIG. 7A and taken along a second direction (D-D')
Figure 7D:
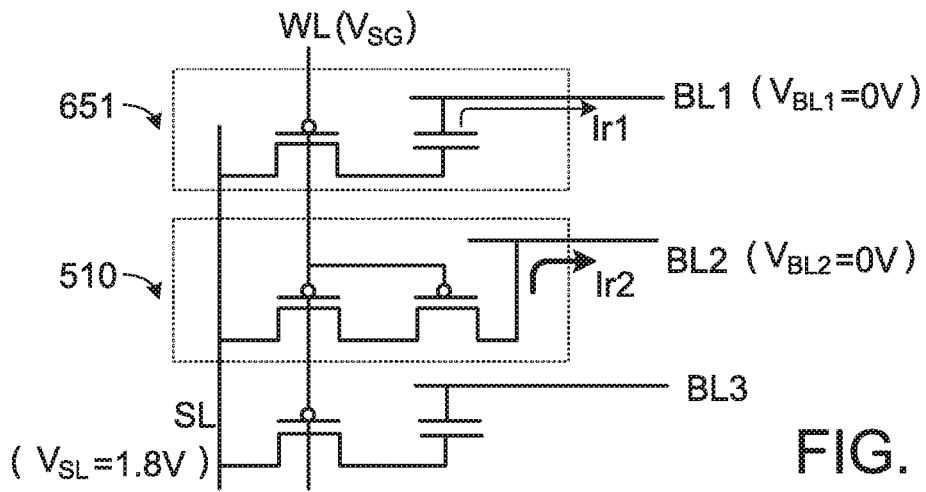
FIG. 7D is a schematic equivalent circuit diagram of the read-only memory cell array as shown in FIG. 7A.

Please refer to FIGS. 7A~7D. FIG. 7A is a schematic top view illustrating the structure of a read-only memory cell array according to a third embodiment of the present invention. FIG. 7B is a schematic cross-sectional view illustrating a first storage memory cell of the read-only memory cell array as shown in FIG. 7A and taken along a first direction (F-F'). FIG. 7C is a schematic cross-sectional view illustrating a second storage memory cell of the read-only memory cell array as shown in FIG. 7A and taken along a second direction (D-D'). FIG. 7D is a schematic equivalent circuit diagram of the read-only memory cell array as shown in FIG. 7A.

In comparison with the read-only memory cell array 500 of this embodiment, the structure of the first storage memory cell 651 of the read-only memory cell array 600 is distinguished. The structure of the second storage memory cell 510 of the read-only memory cell array 600 as shown in FIG. 7C is identical to the structure of the first embodiment as shown in FIG. 5C.

The first storage state memory cell 651 comprises a first p-type transistor and a capacitor. The p-type transistor and the capacitor are constructed in an N-well region NW. Two p-type doped regions 521 and 622 are formed in the N-well region NW. In addition, a polysilicon gate 530 is spanned over the area between the p-type doped region 521 and a first side of the p-type doped region 622. The first p-type transistor is defined by the polysilicon gate 530 and the p-type doped regions 521 and 622 collaboratively. A second side of the p-type doped region 622 is covered by a polysilicon layer 656. Consequently, the capacitor is defined by the p-type doped region 622 and the polysilicon layer 656 collaboratively. Moreover, the polysilicon layer 656 is connected to a bit line BL1.

As shown in FIG. 7B, the first p-type transistor of the first storage state memory cell 651 is used as a select transistor. The polysilicon gate 530 of the first p-type transistor is connected to a word line WL. The p-type doped region 521 is a p-type doped source region and connected to a source line SL. The p-type doped region 622 is a p-type doped drain region of the first p-type transistor. Moreover, the p-type doped region 622 is connected to a first terminal of the capacitor. A second terminal of the capacitor is connected to a bit line BL1.

Please refer to the equivalent circuit as shown in FIG. 7D. The first storage state memory cell 651 comprises the first p-type transistor and the capacitor. A first terminal (i.e., a source terminal) of the first p-type transistor is connected to the source line SL. A gate terminal of the first p-type transistor is connected to the word line WL. A second terminal (i.e., a drain terminal) of the first p-type transistor is connected to the first terminal of the capacitor. A second terminal of the capacitor is connected to the bit line BL1.

The second storage state memory cell 510 comprises a second p-type transistor and a third p-type transistor. The third p-type transistor is a select transistor. A first terminal (i.e., a source terminal) of the second p-type transistor is connected to the source line SL. A gate terminal of the second p-type transistor is connected to the word line WL. A second terminal (i.e., a drain terminal) of the second p-type transistor is connected to a first terminal of the third p-type transistor. A second terminal of the third p-type transistor is connected to the bit line BL2. The gate terminal of the second p-type transistor and the gate terminal of the third p-type transistor are connected with each other.

Please refer to FIG. 7D again. When a read action is performed, a select gate voltage $V_{SG}$ is provided to the word line WL. Consequently, the first p-type transistor and the second p-type transistor are turned on. Moreover, a bit line voltage $V_{BL1}$ is provided to the bit line BL1, a bit line voltage $V_{BL2}$ is provided to the bit line BL2, and a source line voltage $V_{SL}$ is provided to the source line SL. For example, the bit line voltage $V_{BL1}$ is equal to the ground voltage (0V), the bit line voltage $V_{BL2}$ is equal to the ground voltage (0V), and the source line voltage $V_{SL}$ is 1.8V. The source line voltage $V_{SL}$ (e.g., 1.8V) is a read voltage.

When the first p-type transistor of the first storage state memory cell 651 is turned on, the first storage state memory cell 651 generates a read current Ir1 to the bit line BL1. Since the second terminal of the first p-type transistor is separated from the bit line BL1 by the capacitor, the magnitude of the read current Ir1 is very low (e.g., nearly zero).

In the second storage state memory cell 510, the gate terminal of the second p-type transistor and the gate terminal of the third p-type transistor are connected with each other. Consequently, when the second p-type transistor and the third p-type transistor are turned on simultaneously, the second storage state memory cell 510 generates a higher read current Ir2 to the bit line BL2.

As mentioned above, during the read action, the storage state of the read-only memory cell can be realized according to the magnitudes of the read currents flowing through the bit lines BL1 and BL2.

Figure 8D:
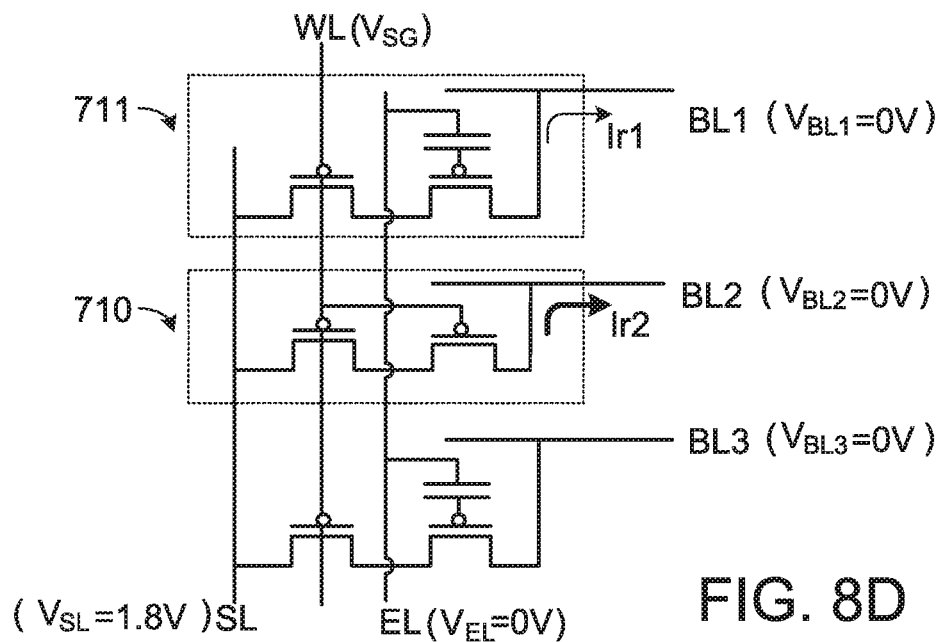
FIG. 8D is a schematic equivalent circuit diagram of the read-only memory cell array as shown in FIG. 8A.

Please refer to FIGS. 8A~8D. FIG. 8A is a schematic top view illustrating the structure of a read-only memory cell array according to a fourth embodiment of the present invention. FIG. 8B is a schematic cross-sectional view illustrating a first storage memory cell of the read-only memory cell array as shown in FIG. 8A and taken along a first direction (G-G'). FIG. 8C is a schematic cross-sectional view illustrating a second storage memory cell of the read-only memory cell array as shown in FIG. 8A and taken along a second direction (H-H'). FIG. 8D is a schematic equivalent circuit diagram of the read-only memory cell array as shown in FIG. 8A. The memory cell array 700 comprises a first storage state memory cell 711 and a second storage state memory cell 710.

The first storage state memory cell 711 comprises two serially-connected p-type transistors. The two p-type transistors are constructed in an N-well region NW. Three p-type doped regions 721, 722 and 723 are formed in the N-well region NW. In addition, two polysilicon gates 730 and 726 are spanned over the areas between the three p-type doped regions 721, 722 and 723. The polysilicon gate 730 is a select gate. The polysilicon gate 726 is a floating gate. The first p-type transistor is defined by the polysilicon gate 730 and the p-type doped regions 721 and 722 collaboratively. The second p-type transistor is defined by the polysilicon gate 726 and the p-type doped regions 722 and 723 collaboratively. The first p-type transistor is used as a select transistor. The second p-type transistor is used as a floating gate transistor.

In this embodiment, the N-well region NW and a P-well region PW are separated by an isolation structure 732. For example, the isolation structure 732 is a shallow trench isolation structure. The polysilicon gate 726 is extended to the position over the P-well region PW through the isolation structure 732. Consequently, a capacitor is defined by the polysilicon gate 726 and the P-well region PW. Moreover, the P-well region PW is connected to an erase line EL.

Please refer to FIG. 8B. In the first storage state memory cell 711, the polysilicon gate 730 of the first p-type transistor is connected to a word line WL, and the p-type doped region 721 is connected to a source line SL. Moreover, the p-type doped region 722 may be considered as a combination of a p-type doped drain region of the first p-type transistor and a first p-type doped region of the second p-type transistor. The floating gate 726 is located at the top side of the second p-type transistor. The second p-type doped region 723 of the second p-type transistor is connected to a bit line BL1. Moreover, the capacitor is connected between the floating gate 726 and the erase line EL.

Please refer to FIGS. 8A and 8C. The second storage state memory cell 710 comprises a third p-type transistor and a fourth p-type transistor. In comparison with the first storage state memory cell 711, the second storage state memory cell 710 is not equipped with the floating gate. Whereas, the polysilicon gate 730 of the third p-type transistor is extended to the fourth p-type transistor and used as the gate of the fourth p-type transistor. In other words, the fourth p-type transistor of the second storage state memory cell 710 is not a floating gate transistor. Moreover, the polysilicon gate 730 is extended to the position over the isolation structure 732 only. In other words, no capacitor is formed between the polysilicon gate 730 and the P-well region PW.

The second storage state memory cell 710 comprises two serially-connected p-type transistors. The two p-type transistors are constructed in the N-well region NW. The third p-type transistor is used as a select transistor. The polysilicon gate 730 of the third p-type transistor is connected to a word line WL. The p-type doped region 741 is a p-type doped source region and connected to a source line SL. The p-type doped region 742 is a p-type doped drain region. Moreover, the p-type doped region 742 may be considered as a combination of a p-type doped drain region of the third p-type transistor and a first p-type doped region of the fourth p-type transistor. The second p-type doped region 743 of the fourth p-type transistor is connected to a bit line BL2. Moreover, the polysilicon gate 730 of the third p-type transistor and the polysilicon gate 730 of the fourth p-type transistor are connected with each other.

Please refer to the equivalent circuit as shown in FIG. 8D. The first storage state memory cell 711 comprises the first p-type transistor, the second p-type transistor and the capacitor. A first terminal (i.e., a source terminal) of the first p-type transistor is connected to the source line SL. A gate terminal of the first p-type transistor is connected to the word line WL. A second terminal (i.e., a drain terminal) of the first p-type transistor is connected to a first terminal of the second p-type transistor. A second terminal of the second p-type transistor is connected to the bit line BL1. A gate terminal of the second p-type transistor is connected to a first terminal of the capacitor. A second terminal of the capacitor is connected to the erase line EL.

The second storage state memory cell 710 comprises the third p-type transistor and the fourth p-type transistor. A first terminal (i.e., a source terminal) of the third p-type transistor is connected to the source line SL. A gate terminal of the third p-type transistor is connected to the word line WL. A second terminal (i.e., a drain terminal) of the third p-type transistor is connected to a first terminal of the fourth p-type transistor. A second terminal of the fourth p-type transistor is connected to the bit line BL2. The gate terminal of the fourth p-type transistor and the gate terminal of the third p-type transistor are connected with each other.

Please refer to FIG. 8D again. When a read action is performed, a select gate voltage $V_{SG}$ is provided to the word line WL. Consequently, the first p-type transistor and the third p-type transistor are turned on. Moreover, a bit line voltage $V_{BL1}$ is provided to the bit line BL1, a bit line voltage $V_{BL2}$ is provided to the bit line BL2, a source line voltage $V_{SL}$ is provided to the source line SL, and an erase line voltage $V_{EL}$ is provided to the erase line EL. For example, the bit line voltage $V_{BL1}$ is equal to the ground voltage (0V), the bit line voltage $V_{BL2}$ is equal to the ground voltage (0V), and the source line voltage $V_{SL}$ is 1.8V. The erase line voltage $V_{EL}$ is equal to the ground voltage (0V). The source line voltage $V_{SL}$ (e.g., 1.8V) is a read voltage.

When the first p-type transistor of the first storage state memory cell 711 is turned on, the second p-type transistor is turned off because no electrons are stored in the floating gate 726 of the second p-type transistor. Consequently, the first storage state memory cell 711 generates a read current Ir1 to the bit line BL1. The magnitude of the read current Ir1 is very low (e.g., nearly zero).

In the second storage state memory cell 710, the gate terminal of the third p-type transistor and the gate terminal of the fourth p-type transistor are connected with each other. Consequently, when the third p-type transistor and the fourth p-type transistor are turned on simultaneously, the second storage state memory cell 710 generates a higher read current Ir2 to the bit line BL2.

As mentioned above, during the read action, the storage state of the read-only memory cell can be realized according to the magnitudes of the read currents flowing through the bit lines BL1 and BL2.

It is noted that the structure of the memory cell array 700 may be further modified. For example, in another embodiment, the polysilicon gate 730 of the second storage state memory cell 710 is extended to the position over the P-well region PW. Consequently, another capacitor is formed between the polysilicon gate 730 and the P-well region PW. Alternatively, the polysilicon gate 726 of the first storage state memory cell 711 is extended to the position over the isolation structure 732 only. Consequently, no capacitor is defined by the polysilicon gate 726 and the P-well region PW. Alternatively, the polysilicon gate 726 of the second p-type transistor in the first storage memory cell 751 is extended. Consequently, the channel length of the second p-type transistor of the first storage memory cell 711 is larger than the channel length of the fourth p-type transistor of the second storage memory cell 710.

Figure 9A:
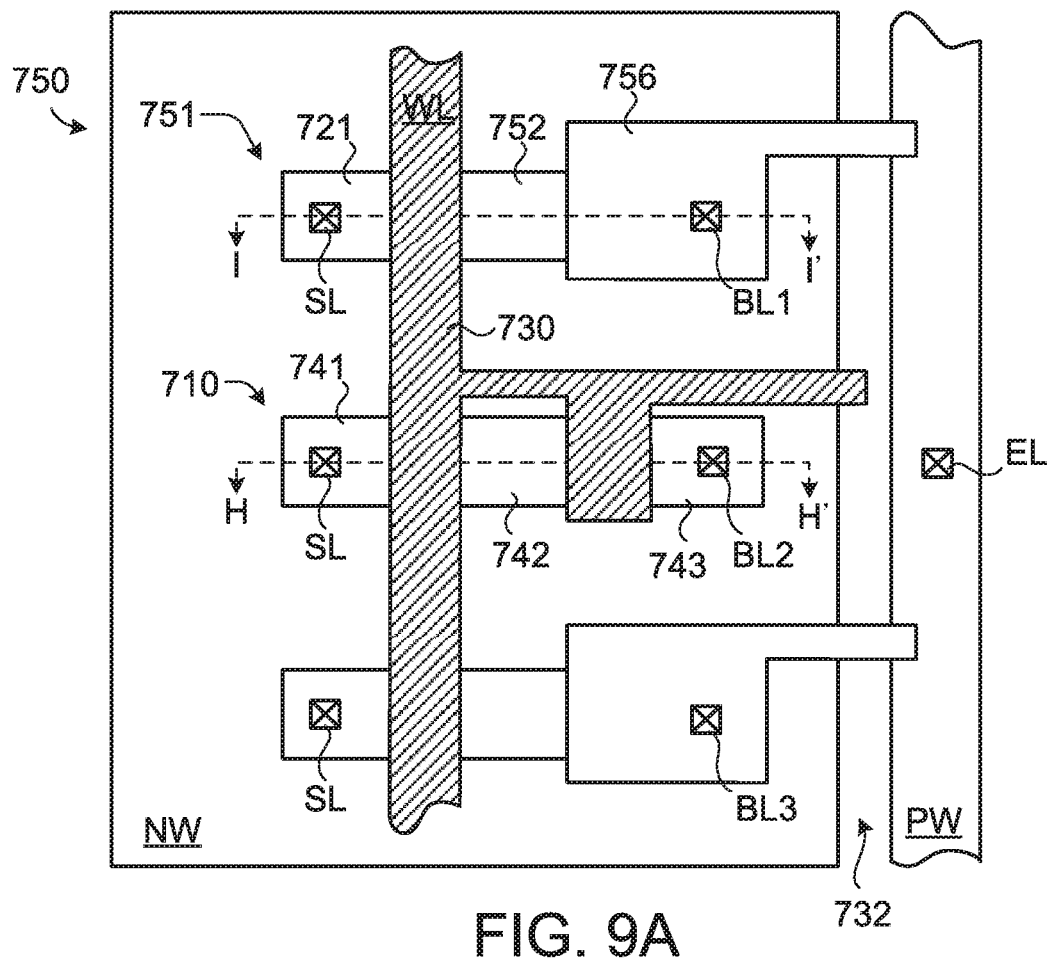
FIG. 9A is a schematic top view illustrating the structure of a read-only memory cell array according to a fifth embodiment of the present invention.
Figure 9B:
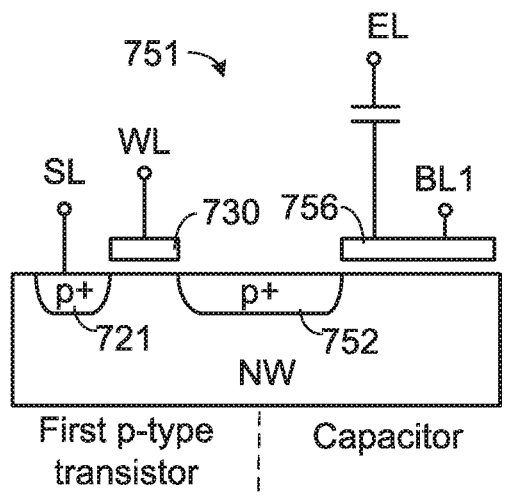
FIG. 9B is a schematic cross-sectional view illustrating a first storage memory cell of the read-only memory cell array as shown in FIG. 9A and taken along a first direction (I-I')
Figure 9C:
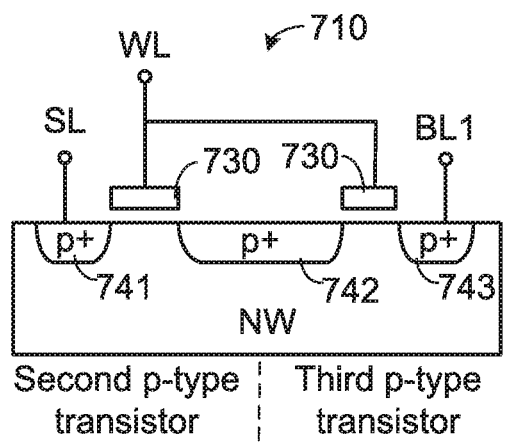
FIG. 9C is a schematic cross-sectional view illustrating a second storage memory cell of the read-only memory cell array as shown in FIG. 9A and taken along a second direction (H-H')
Figure 9D:
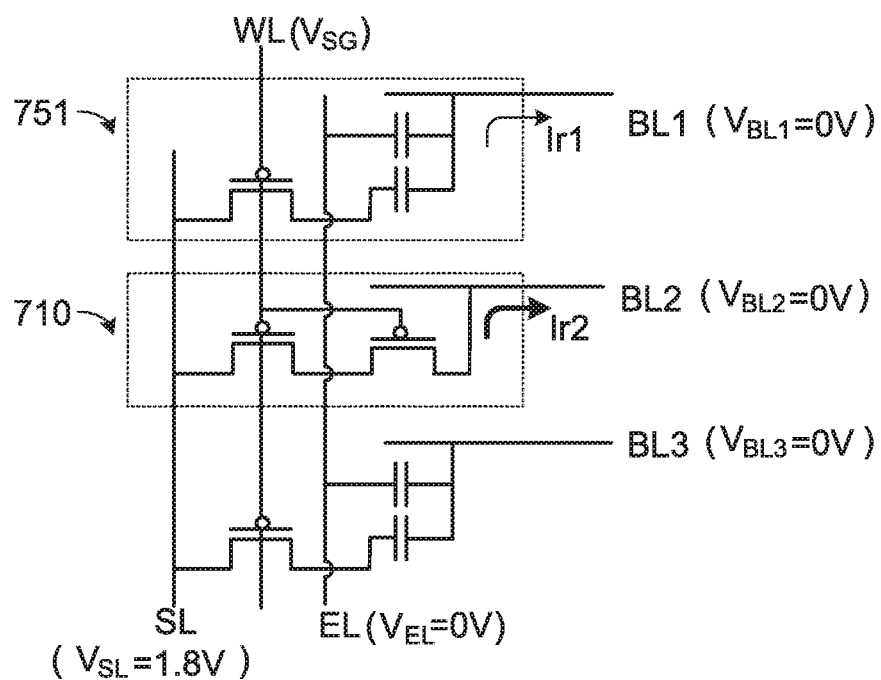
FIG. 9D is a schematic equivalent circuit diagram of the read-only memory cell array as shown in FIG. 9A.

Please refer to FIGS. 9A~9D. FIG. 9A is a schematic top view illustrating the structure of a read-only memory cell array according to a fifth embodiment of the present invention. FIG. 9B is a schematic cross-sectional view illustrating a first storage memory cell of the read-only memory cell array as shown in FIG. 9A and taken along a first direction (I-I'). FIG. 9C is a schematic cross-sectional view illustrating a second storage memory cell of the read-only memory cell array as shown in FIG. 9A and taken along a second direction (H-H'). FIG. 9D is a schematic equivalent circuit diagram of the read-only memory cell array as shown in FIG. 9A.

In comparison with the read-only memory cell array 700 of the fourth embodiment, the structure of the first storage memory cell 751 of the read-only memory cell array 750 of this embodiment is distinguished. The structure of the second storage memory cell 710 of the read-only memory cell array 700 as shown in FIG. 9C is identical to the structure of the fourth embodiment as shown in FIG. 8C. The memory cell array 750 comprises a first storage state memory cell 751 and a second storage state memory cell 710.

The first storage state memory cell 751 comprises a first p-type transistor and two capacitors. The first p-type transistor and the two capacitors are constructed in an N-well region NW. Two p-type doped regions 721 and 752 are formed in the N-well region NW. In addition, a polysilicon gate 730 is spanned over the area between the p-type doped region 721 and a first side of the p-type doped region 752. The first p-type transistor is defined by the polysilicon gate 730 and the p-type doped regions 721 and 752 collaboratively. A second side of the p-type doped region 752 is covered by a polysilicon layer 756. Consequently, the first capacitor is defined by the p-type doped region 752 and the polysilicon layer 756 collaboratively. The polysilicon layer 756 is connected to a bit line BL1. Moreover, the polysilicon layer 756 is extended to the position over the P-well region PW through the isolation structure 732. Consequently, a second capacitor is defined by the polysilicon layer 756 and the P-well region PW. Moreover, the P-well region PW is connected to an erase line EL.

Please refer to FIG. 9B. In the first storage state memory cell 751, the first p-type transistor is used as a select transistor. The polysilicon gate 730 of the first p-type transistor is connected to a word line WL. The p-type doped region 721 is a p-type doped source region and connected to a source line SL. Moreover, the p-type doped region 752 is a p-type doped drain region of the first p-type transistor and connected to the first terminal of the first capacitor. A second terminal of the first capacitor is connected to a bit line BL1. Moreover, the second capacitor is connected between the bit line BL1 and the erase line EL.

Please refer to the equivalent circuit as shown in FIG. 9D. The first storage state memory cell 751 comprises the first p-type transistor, the first capacitor and the second capacitor. A first terminal (i.e., a source terminal) of the first p-type transistor is connected to the source line SL. A gate terminal of the first p-type transistor is connected to the word line WL. A second terminal (i.e., a drain terminal) of the first p-type transistor is connected to the first terminal of the first capacitor. A second terminal of the first capacitor is connected to the bit line BL1. Moreover, the second capacitor is connected between the bit line BL1 and the erase line EL.

The second storage state memory cell 710 comprises a second p-type transistor and a third p-type transistor. A first terminal (i.e., a source terminal) of the second p-type transistor is connected to the source line SL. A gate terminal of the second p-type transistor is connected to the word line WL. A second terminal (i.e., a drain terminal) of the second p-type transistor is connected to a first terminal of the third p-type transistor. A second terminal of the third p-type transistor is connected to the bit line BL2. The gate terminal of the third p-type transistor and the gate terminal of the second p-type transistor are connected with each other.

Please refer to FIG. 9D again. When a read action is performed, a select gate voltage $V_{SG}$ is provided to the word line WL. Consequently, the first p-type transistor and the second p-type transistor are turned on. Moreover, a bit line voltage $V_{BL1}$ is provided to the bit line BL1, a bit line voltage $V_{BL2}$ is provided to the bit line BL2, a source line voltage $V_{SL}$ is provided to the source line SL, and an erase line voltage $V_{EL}$ is provided to the erase line EL. For example, the bit line voltage $V_{BL1}$ is equal to the ground voltage (0V), the bit line voltage $V_{BL2}$ is equal to the ground voltage (0V), and the source line voltage $V_{SL}$ is 1.8V. The erase line voltage $V_{EL}$ is equal to the ground voltage (0V). The source line voltage $V_{SL}$ (e.g., 1.8V) is a read voltage.

When the first p-type transistor of the first storage state memory cell 751 is turned on, the first storage state memory cell 751 generates a read current Ir1 to the bit line BL1. Since the drain terminal of the first p-type transistor is separated from the bit line BL1 by the first capacitor, the magnitude of the read current Ir1 is very low (e.g., nearly zero).

In the second storage state memory cell 710, the gate terminal of the second p-type transistor and the gate terminal of the third p-type transistor are connected with each other. Consequently, when the second p-type transistor and the third p-type transistor are turned on simultaneously, the second storage state memory cell 710 generates a higher read current Ir2 to the bit line BL2.

As mentioned above, during the read action, the storage state of the read-only memory cell can be realized according to the magnitudes of the read currents flowing through the bit lines BL1 and BL2.

From the above descriptions, the present invention provides a read-only memory cell and an associated memory cell array. After the memory cell array is produced, the first storage state memory cell and the second storage state memory cell are included in the memory cell array. Since the first storage state memory cell and the second storage state memory cell have different structures, the magnitudes of the read currents generated by the first storage state memory cell and the second storage state memory cell are different. The storage states of the read-only memory cell can be realized according to the magnitudes of the read currents.

In the above embodiments, the transistors are p-type transistors. It is noted that the types of the transistors are not restricted. For example, in some other embodiments, the transistors are n-type transistors. Moreover, during the read action, the magnitudes of the bias voltages provided to the memory cell array are not restricted. That is, during the read action, other bias voltages can be provided to the memory cell array according to the practical requirements.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A read-only memory cell array, comprising:
   a first storage state memory cell comprising a first transistor and a second transistor, wherein a first terminal of the first transistor is connected to a source line, a gate terminal of the first transistor is connected to a word line, a first terminal of the second transistor is connected to a second terminal of the first transistor, and a second terminal of the second transistor is connected to a first bit line, wherein the second transistor is a floating gate transistor; and
   a second storage state memory cell comprising a third transistor and a fourth transistor, wherein a first terminal of the third transistor is connected to the source line, a gate terminal of the third transistor is connected to the word line, a first terminal of the fourth transistor is connected to a second terminal of the third transistor, a second terminal of the fourth transistor is connected to a second bit line, and a gate terminal of the fourth transistor is directly connected to the gate terminal of the third transistor, wherein the fourth transistor is not the floating gate transistor.

2. The read-only memory cell array as claimed in claim 1, wherein a channel length of the second transistor is larger than a channel length of the fourth transistor.

3. The read-only memory cell array as claimed in claim 1, further comprising:
- an N-well region;
- a first p-type doped region, a second p-type doped region, a third p-type doped region, a fourth p-type doped region, a fifth p-type doped region and a sixth p-type doped region formed in the N-well region, wherein the first p-type doped region is connected to the source line, the third p-type doped region is connected to the first bit line, the fourth p-type doped region is connected to the source line, and the sixth p-type doped region is connected to the second bit line;
- a first polysilicon gate spanned over an area between the first p-type doped region and the second p-type doped region, spanned over an area between the fourth p-type doped region and the fifth p-type doped region, and spanned over an area between the fifth p-type doped region and the sixth p-type doped region, wherein the first polysilicon gate is connected to the word line; and
- a second polysilicon gate spanned over an area between the second p-type doped region and the third p-type doped region,
- wherein the first transistor is defined by the first polysilicon gate, the first p-type doped region and the second p-type doped region collaboratively, the second transistor is defined by the second polysilicon gate, the second p-type doped region and the third p-type doped region collaboratively, the third transistor is defined by the first polysilicon gate, the fourth p-type doped region and the fifth p-type doped region collaboratively, and the fourth transistor is defined by the first polysilicon gate, the fifth p-type doped region and the sixth p-type doped region collaboratively.

4. The read-only memory cell array as claimed in claim 3, wherein the first storage state memory cell further comprises a first capacitor, and the first capacitor is connected between a floating gate of the second transistor and an erase line.

5. The read-only memory cell array as claimed in claim 4, further comprising a P-well region, wherein the P-well region is connected to the erase line, and the second polysilicon gate is extended to the P-well region, so that the first capacitor is defined by the second polysilicon gate and the P-well region collaboratively.

6. The read-only memory cell array as claimed in claim 4, wherein the second storage state memory cell further comprises a second capacitor, and the second capacitor is connected between the gate terminal of the fourth transistor and the erase line.

7. The read-only memory cell array as claimed in claim 6, further comprising a P-well region, wherein the P-well region is connected to the erase line, and the first polysilicon gate is extended to the P-well region, so that the second capacitor is defined by the first polysilicon gate and the P-well region collaboratively.

8. A read-only memory cell array, comprising:
- a first storage state memory cell comprising a first transistor and a first capacitor, wherein a first terminal of the first transistor is connected to a source line, a gate terminal of the first transistor is connected to a word line, a first terminal of the first capacitor is connected to a second terminal of the first transistor, and a second terminal of the first capacitor is connected to a first bit line; and
- a second storage state memory cell comprising a second transistor and a third transistor, wherein a first terminal of the second transistor is connected to the source line, a gate terminal of the second transistor is connected to the word line, a first terminal of the third transistor is connected to a second terminal of the second transistor, a second terminal of the third transistor is connected to a second bit line, and a gate terminal of the third transistor is connected to the gate terminal of the second transistor.

9. The read-only memory cell array as claimed in claim 8, further comprising:
- an N-well region;
- a first p-type doped region, a second p-type doped region, a third p-type doped region, a fourth p-type doped region and a fifth p-type doped region formed in the N-well region, wherein the first p-type doped region is connected to the source line, the third p-type doped region is connected to the source line, and the fifth p-type doped region is connected to the second bit line;
- a polysilicon gate spanned over an area between the first p-type doped region and the second p-type doped region, spanned over an area between the third p-type doped region and the fourth p-type doped region, and spanned over an area between the fourth p-type doped region and the fifth p-type doped region, wherein the polysilicon gate is connected to the word line; and
- a polysilicon layer arranged beside a side of the second p-type doped region and connected to the first bit line, wherein the first capacitor is defined by the polysilicon layer and the second p-type doped region collaboratively,
- wherein the first transistor is defined by the polysilicon gate, the first p-type doped region and the second p-type doped region collaboratively, the second transistor is defined by the polysilicon gate, the third p-type doped region and the fourth p-type doped region collaboratively, and the third transistor is defined by the polysilicon gate, the fourth p-type doped region and the fifth p-type doped region collaboratively.

10. The read-only memory cell array as claimed in claim 9, wherein the first storage state memory cell further comprises a second capacitor, and the second capacitor is connected between the first bit line and an erase line.

11. The read-only memory cell array as claimed in claim 10, wherein further comprising a P-well region, wherein the P-well region is connected to the erase line, and the polysilicon layer is extended to the P-well region, so that the second capacitor is defined by the polysilicon layer and the P-well region collaboratively.

12. The read-only memory cell array as claimed in claim 9, wherein the first storage state memory cell further comprises a second capacitor, and the second capacitor is connected between the gate terminal of the third transistor and an erase line.

13. The read-only memory cell array as claimed in claim 12, wherein further comprising a P-well region, wherein the P-well region is connected to the erase line, and the polysilicon gate is extended to the P-well region, so that the second capacitor is defined by the polysilicon gate and the P-well region collaboratively.

* * * * *